US010797570B2

(12) United States Patent
Yatsugi et al.

(10) Patent No.: US 10,797,570 B2
(45) Date of Patent: Oct. 6, 2020

(54) ELECTRIC DRIVE DEVICE AND ELECTRIC POWER STEERING APPARATUS

(71) Applicant: HITACHI AUTOMOTIVE SYSTEMS, LTD., Hitachinaka-shi, Ibaraki (JP)

(72) Inventors: Tomishige Yatsugi, Hitachinaka (JP); Takuro Kanazawa, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 16/631,316

(22) PCT Filed: Mar. 7, 2018

(86) PCT No.: PCT/JP2018/008701
§ 371 (c)(1),
(2) Date: Jan. 15, 2020

(87) PCT Pub. No.: WO2019/016999
PCT Pub. Date: Jan. 24, 2019

(65) Prior Publication Data
US 2020/0212767 A1    Jul. 2, 2020

(30) Foreign Application Priority Data

Jul. 21, 2017   (JP) .................................. 2017-141788

(51) Int. Cl.
*B62D 5/04*     (2006.01)
*H02K 11/33*    (2016.01)
(Continued)

(52) U.S. Cl.
CPC ........... *H02K 11/33* (2016.01); *B62D 5/0463* (2013.01); *H01L 23/3121* (2013.01);
(Continued)

(58) Field of Classification Search
CPC ............ H02K 9/02; H02K 5/225; H02K 9/22; H02K 2211/03; H02K 2213/06;
(Continued)

(56) References Cited

U.S. PATENT DOCUMENTS 6,577,030 B2 * 6/2003 Tominaga ............ B62D 5/0406
310/64
2005/0167183 A1 * 8/2005 Tominaga ............ H05K 7/1432
180/444

(Continued)

FOREIGN PATENT DOCUMENTS

JP    2001-110985 A    4/2001
JP    2016-36246 A     3/2016
(Continued)

OTHER PUBLICATIONS

International Search Report (PCT/ISA/210) issued in PCT Application No. PCT/JP2018/008701 dated May 22, 2018 with English translation (three (3) pages).

(Continued)

*Primary Examiner* — Alex W Mok
(74) *Attorney, Agent, or Firm* — Crowell & Moring LLP

(57) ABSTRACT

Power conversion circuit unit defined by rotation shaft-side line facing toward rotation shaft of electric motor, control output terminal-side line facing toward coil input terminals of electric motor and side lines connecting both end portions of rotation shaft-side line and control output terminal-side line is packaged with synthetic resin. Three-phase control output terminals connected to the coil input terminals are formed at control output terminal-side line. Power switching elements forming upper and lower arms for each phase are arranged in a zigzag formation along control output terminal-side line with power switching elements being offset from a substantially middle between rotation shaft-side line and control output terminal-side line toward control output (Continued)

terminal-side line. With this, size of power conversion circuit unit can be reduced, and heat of power conversion circuit unit can be efficiently released to the outside.

10 Claims, 9 Drawing Sheets

(51) Int. Cl.
  *H05K 7/20* (2006.01)
  *H05K 5/00* (2006.01)
  *H01L 23/31* (2006.01)
  *H02K 5/22* (2006.01)
  *H02K 9/22* (2006.01)
  *H02K 11/40* (2016.01)

(52) U.S. Cl.
  CPC ............... *H02K 5/225* (2013.01); *H02K 9/22* (2013.01); *H02K 11/40* (2016.01); *H05K 5/0017* (2013.01); *H05K 5/0026* (2013.01); *H05K 7/209* (2013.01); *H05K 7/20854* (2013.01); *H02K 2211/03* (2013.01); *H02K 2213/06* (2013.01)

(58) Field of Classification Search
  CPC ............... H02M 7/003; H02M 7/44; H01L 2224/40245; H01L 2224/48247; H01L 2924/181; H01L 2924/00012; H01L 23/3121; B62D 5/0463; H05K 5/0017; H05K 5/0026; H05K 7/20854; H05K 7/209

USPC ............................................. 310/64
  See application file for complete search history.

(56) References Cited

U.S. PATENT DOCUMENTS

| | | | | |
|---|---|---|---|---|
| 2012/0098365 | A1* | 4/2012 | Yamasaki | B62D 5/0406 310/71 |
| 2012/0104886 | A1* | 5/2012 | Yamasaki | B62D 5/0406 310/71 |
| 2013/0248277 | A1* | 9/2013 | Hagiwara | B62D 5/0406 180/443 |
| 2013/0249335 | A1* | 9/2013 | Motoda | H02K 11/0094 310/71 |
| 2016/0036304 | A1 | 2/2016 | Yamasaki et al. | |
| 2016/0065030 | A1* | 3/2016 | Fujimoto | B62D 5/046 180/446 |
| 2016/0351488 | A1 | 12/2016 | Kamiyama | |

FOREIGN PATENT DOCUMENTS

| | | |
|---|---|---|
| WO | WO 2016/194033 A1 | 12/2016 |
| WO | WO 2018/230211 A1 | 12/2018 |
| WO | WO 2019/003501 A1 | 1/2019 |
| WO | WO 2019/012792 A1 | 1/2019 |

OTHER PUBLICATIONS

Japanese-language Written Opinion (PCT/ISA/237) issued in PCT Application No. PCT/JP2018/008701 dated May 22, 2018 with English translation (nine (9) pages).

* cited by examiner

ELECTRIC DRIVE DEVICE AND ELECTRIC POWER STEERING APPARATUS

TECHNICAL FIELD

The present invention relates to an electric drive device and an electric power steering apparatus (an electric power steering device), and more particularly to an electric drive device and an electric power steering device in which an electronic control device is mounted.

BACKGROUND ART

In a field of general industrial equipment, a mechanical control element is driven by an electric motor. In recent years, so-called electrically mechanically integrated electric drive device, which is configured such that an electronic control unit formed from a semiconductor element etc. controlling a rotation speed and/or a rotation torque of the electric motor is integrally mounted in the electric motor, has been used.

As an example of the electrically mechanically integrated electric drive device, for instance, an electric power steering device is configured such that a turning direction and a turning torque of a steering shaft that turns by driver's operation of a steering wheel are detected, and on the basis of these detection values, the electric motor is driven so as to rotate in the same direction as the turning direction of the steering shaft, then a steering assist torque is generated. To control this electric motor, the power steering device is provided with an electronic control unit (ECU: Electronic Control Unit).

As a related art electric power steering device, for instance, an electric power steering device disclosed in Japanese Unexamined Patent Application Publication No. 2016-036246 (Patent Document 1) is known. Patent Document 1 discloses the electric power steering device configured by an electric motor unit and an electronic control unit. An electric motor of the electric motor unit is housed in a motor housing having a cylindrical portion made of aluminum alloy etc. A board of the electronic control unit on which electronic elements or components are mounted is fixed to a heat sink member that is located at an opposite side to an output shaft of the electric motor in an axial direction of the motor housing and serves as a lid of the motor housing.

The board fixed to the heat sink member mounts thereon a power supply circuit unit, a power conversion circuit unit (a power module) having a power switching element such as a MOSFET and an IGBT that drive and control the electric motor, and a control circuit unit that controls the power switching element. An output terminal of the power switching element and an input terminal of the electric motor are electrically connected through bus bars.

Power is supplied to the electronic control unit fixed to the heat sink member from a power supply through a connector case made of synthetic resin. Further, detection signals concerning an operating state etc. are sent to the electronic control unit from detection sensors. The connector case functions as a lid member or a cover member, and is fixed to an outer peripheral surface of the heat sink member with a fixing screw so as to hermetically seal the heat sink member.

In the electric power steering device having such configuration as disclosed in Patent Document 1, the control circuit unit, the power supply circuit unit and the power conversion circuit unit are mounted on the one circuit board. And, in order to radiate or release heat from this circuit board to the outside, the circuit board is fixed to the heat sink member serving as the lid member of the motor housing.

As another electric drive device in which the electronic control device is integrally mounted, an electric brake and an electric hydraulic pressure controller for various kinds of hydraulic pressure control are known. In the following description, the electric power steering device from among these electric drive devices will be explained.

CITATION LIST

Patent Document

Patent Document 1: Japanese Unexamined Patent Application Publication No. 2016-036246

SUMMARY OF THE INVENTION

Technical Problem

This kind of electric power steering device is placed in an engine room of the vehicle. Therefore, size reduction in configuration of the electric power steering device is required. In particular, there has been a tendency in recent years for various auxiliary devices such as an exhaust gas control device and a safety precaution device to be disposed in the engine room of the vehicle. It is therefore required for the auxiliary devices including the electric power steering device to be as small as possible. Particularly, size reduction in a radial direction is required.

Further, in addition to the size reduction, it is also required to provide a redundant system (a dual-redundancy system) for the electronic control unit. However, if electronic control units forming the redundant system are mounted on the one circuit board, there arises a problem of increasing a size of the circuit board in the radial direction.

To resolve this problem, if two or more circuit boards (a plurality of circuit boards), each of which mounts thereon necessary electronic control circuits, are arranged so as to be stacked in the axial direction of the motor housing, a shape in the radial direction of the electronic control unit can be small, and this would be an effective manner.

Here, an electrical component such as the power switching element forming the power conversion circuit unit, which controls power of the electric motor, has a large heat value. Because of this, besides meeting the requirement of the size reduction, heat of the power switching element has to be efficiently radiated or released to the outside. Accordingly, the electric drive device that is capable of reducing the size of the power conversion circuit unit and efficiently releasing the heat of the power switching element to the outside is required.

An object of the present invention is therefore to provide a new electric drive device and a new electric power steering device that are capable of reducing the size of the power conversion circuit unit and efficiently releasing heat of the power conversion circuit unit to the outside.

Solution to Problem

The present invention is characterized in that a power conversion circuit unit defined by a rotation shaft-side line formed so as to face toward a rotation shaft of an electric motor, a control output terminal-side line formed so as to face toward three-phase coil input terminals of the electric motor and side lines connecting both end portions of the rotation shaft-side line and the control output terminal-side line is formed and packaged with synthetic resin, and three-phase control output terminals connected to the three-phase coil input terminals are formed at the control output terminal-side line, and power switching elements forming upper and lower arms for each phase are arranged in a zigzag formation along the control output terminal-side line with the power switching elements being offset from a substantially middle between the rotation shaft-side line and the control output terminal-side line toward the control output terminal-side line.

Effects of Invention

According to the present invention, since the power switching elements forming the upper and lower arms for each phase are arranged along the control output terminal-side line with the power switching elements being offset from a substantially middle between the rotation shaft-side line and the control output terminal-side line toward the control output terminal-side line, a length of each wire connecting the power switching elements forming the upper and lower arms and the control output terminals can be shortened, thereby reducing a size of the power conversion circuit unit. Further, since the power switching elements forming the upper and lower arms are arranged in the zigzag formation (a staggered arrangement), an area of a metal wiring board can be increased, then a heat releasing performance can be improved by this increased area.

EMBODIMENTS FOR CARRYING OUT THE INVENTION

An embodiment of the present invention be explained in detail below with reference to the drawings. The present invention is not limited to the following embodiment, and includes all design modifications and equivalents belonging to the technical scope of the present invention.

Figure 1:
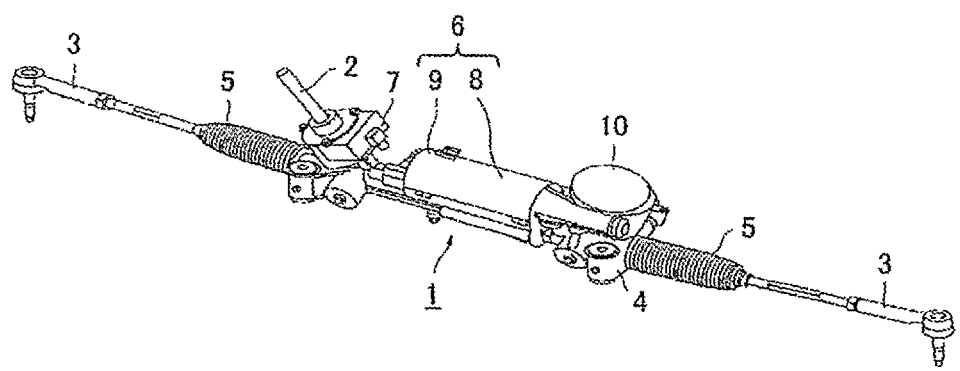
FIG. 1 is a general perspective view of a steering device as an example to which the present invention is applied.

Before explaining the embodiment of the present invention, a configuration of a steering device as an example to which the present invention is applied will be briefly explained using FIG. 1.

First, a steering device to steer front wheels of a vehicle will be explained. A steering device 1 is configured as shown in FIG. 1. A pinion (not shown) is provided at a lower end of a steering shaft 2 connecting to a steering wheel (not shown). This pinion is engaged with a rack (not shown) that extends in right and left directions of a vehicle body. A tie rod 3 to steer the front wheels in the right and left directions is each connected to both ends of the rack. The rack is accommodated in a rack housing 4. Between the rack housing 4 and each tie rod 3, a rubber boot 5 is provided.

The steering device 1 is provided with an electric power steering device 6 to assist torque when performing a turning operation of the steering wheel. That is, a torque sensor 7 that detects a turning direction and a turning torque of the steering shaft 2 is provided. And, an electric motor unit 8 that provides a steering assistive force to the rack via a gear 10 on the basis of a detection value of the torque sensor 7 is provided. Further, an electronic control unit (ECU) 9 that controls an electric motor disposed in the electric motor unit 8 is provided. The electric motor unit 8 of the electric power steering device 6 is connected to the gear 10 at three portions of an outer periphery at an output shaft side of the electric motor unit 8 with bolts (not shown). The electronic control unit 9 is disposed on an opposite side to the output shaft side of the electric motor unit 8.

In the electric power steering device 6, when the steering shaft 2 is turned in any turning direction by the steering wheel operation, the torque sensor 7 detects the turning direction and the turning torque of the steering shaft 2. A control circuit unit calculates a drive operation amount of the electric motor on the basis of these detection values. The electric motor is then driven by a power switching element of a power conversion circuit unit on the basis of the calculated drive operation amount. And, an output shaft of the electric motor rotates so as to drive and rotate the steering shaft 2 in the same direction as a direction of the steering wheel operation. This rotation of the output shaft of the electric motor is transmitted to the rack (not shown) through the pinion (not shown) and the gear 10, and the vehicle is steered. Since such configuration and workings are well known, a further explanation will be omitted here.

As mentioned above, if two or more circuit boards (a plurality of circuit boards), each of which mounts thereon necessary electronic control circuits, are arranged so as to be stacked in the axial direction of the motor housing, a shape in the radial direction of the electronic control unit can be small, and this would be an effective manner for the size reduction.

Here, also as mentioned above, an electrical component such as the power switching element forming the power conversion circuit unit, which controls power of the electric motor, has a large heat value. Because of this, besides meeting the requirement of the size reduction, heat of the power switching element has to be efficiently radiated or released to the outside. From such background, the present embodiment proposes the electric power steering device having the following configuration.

That is, in the present embodiment, a power conversion circuit unit defined by a rotation shaft-side line formed so as to face toward a rotation shaft of an electric motor, a control output terminal-side line formed so as to face toward three-phase coil input terminals of the electric motor and side lines connecting both end portions of the rotation shaft-side line and the control output terminal-side line is formed and packaged with synthetic resin, and three-phase control output terminals connected to the three-phase coil input terminals are formed at the control output terminal-side line, and power switching elements forming upper and lower arms for each phase are arranged in a zigzag formation along the control output terminal-side line with the power switching elements being offset from a substantially middle between the rotation shaft-side line and the control output terminal-side line toward the control output terminal-side line.

According to this configuration, since the power switching elements forming the upper and lower arms for each phase are arranged along the control output terminal-side line with the power switching elements being offset from a substantially middle between the rotation shaft-side line and the control output terminal-side line toward the control output terminal-side line, a length of each wire connecting the power switching elements forming the upper and lower arms and the control output terminals can be shortened, thereby reducing a size of the power conversion circuit unit. Further, since the power switching elements forming the upper and lower arms are arranged in the zigzag formation (a staggered arrangement), an area of a metal wiring board can be increased, then a heat releasing performance can be improved by this increased area.

Figure 2:
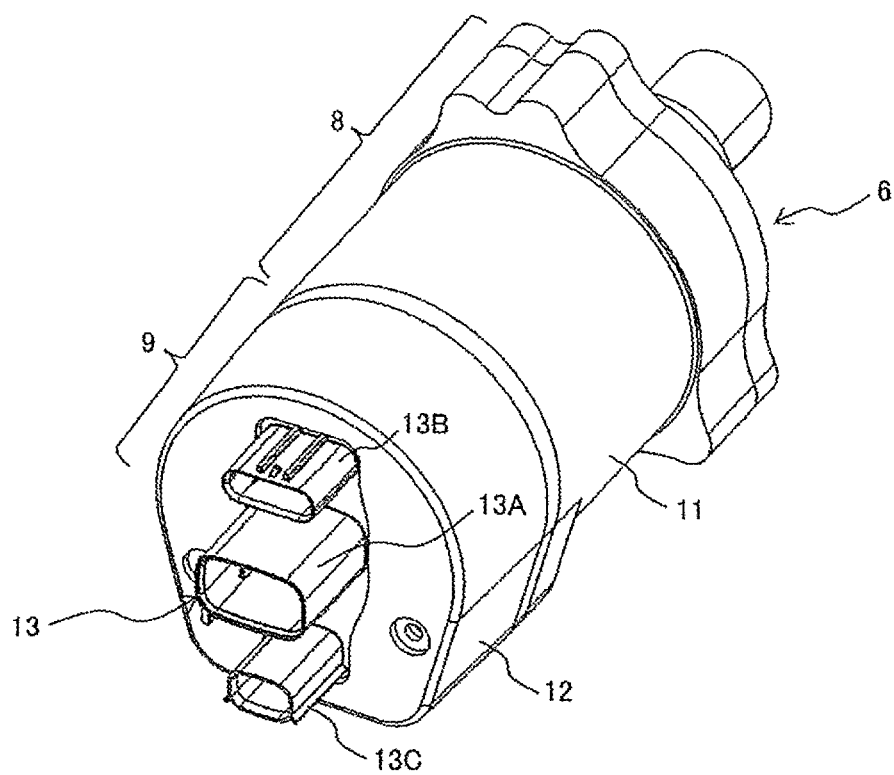
FIG. 2 is a general perspective view of an electric power steering device according to an embodiment of the present invention.
Figure 3:
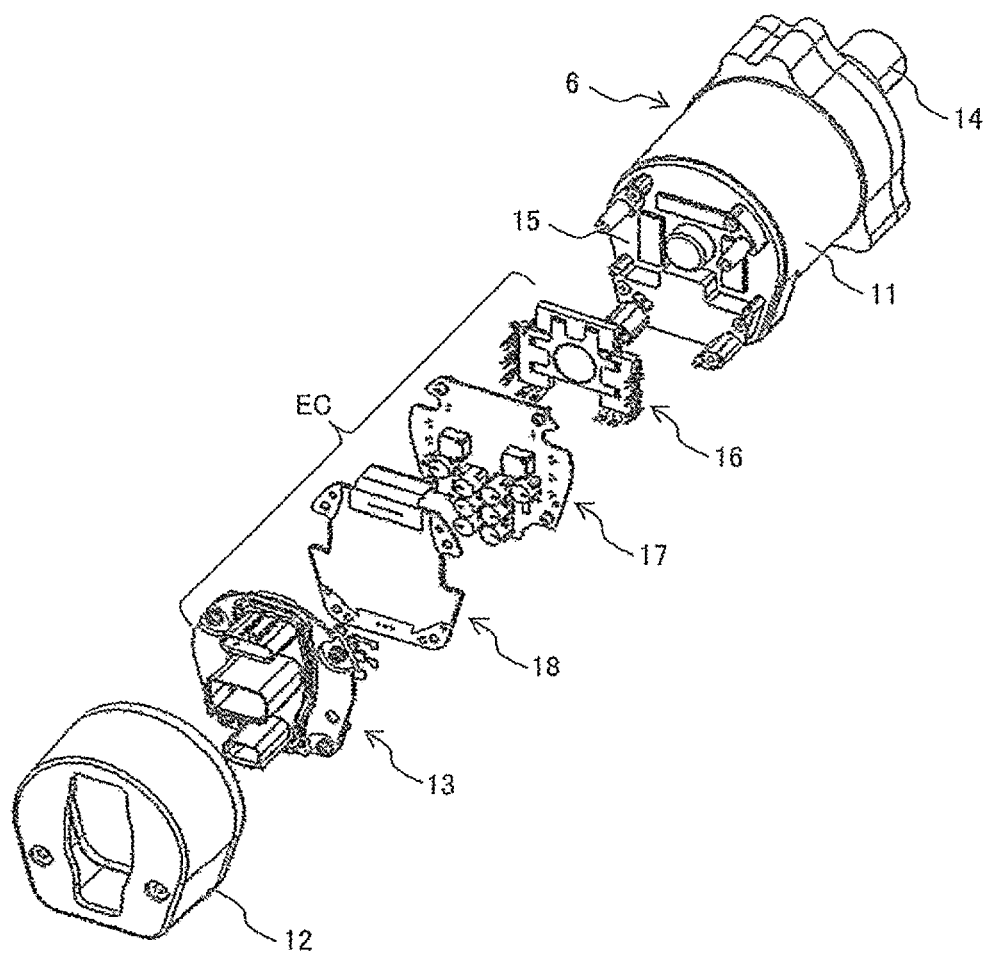
FIG. 3 is a perspective exploded view of the electric power steering device shown in FIG. 2.
Figure 10:
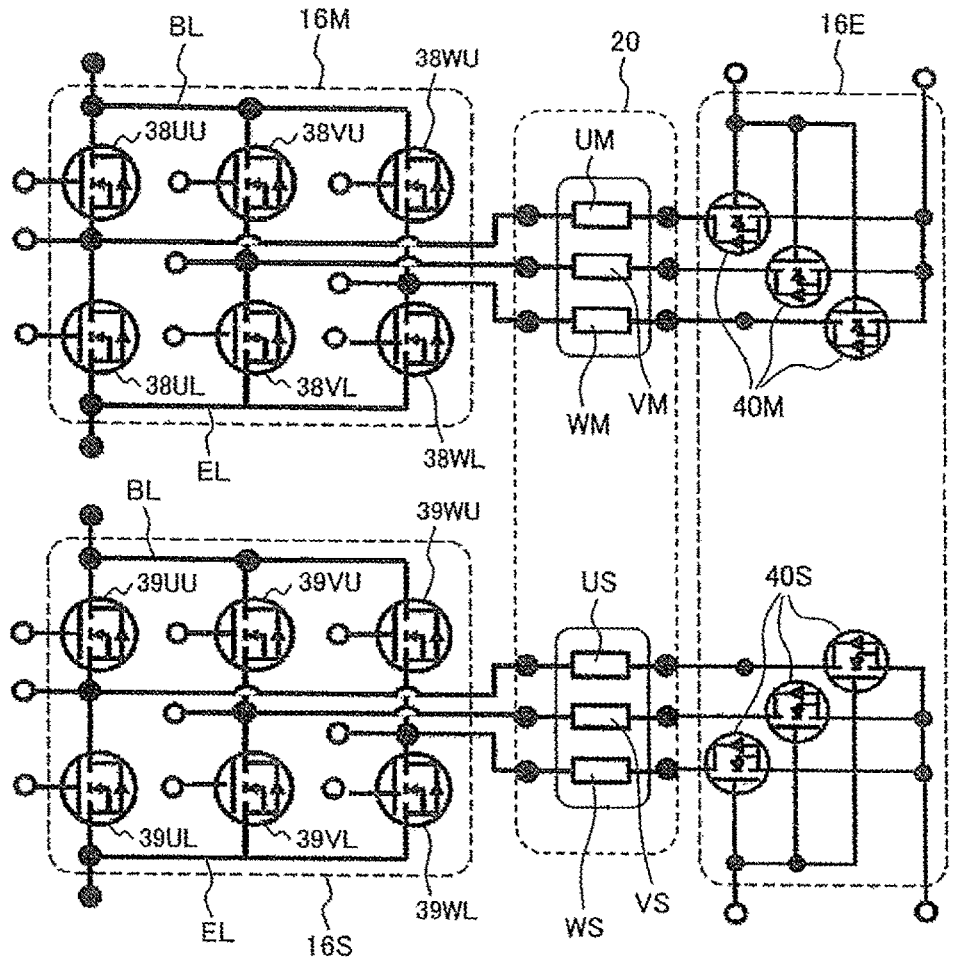
FIG. 10 is a circuit diagram showing a circuit configuration of the power conversion circuit unit forming a redundant system.
Figure 11:
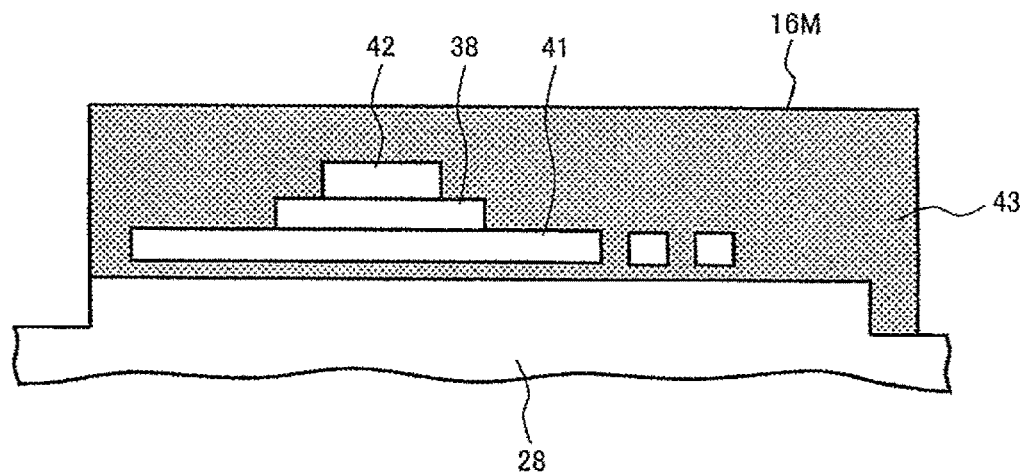
FIG. 11 is a drawing schematically showing a cross section of one power conversion circuit unit of the redundant system.
Figure 12:
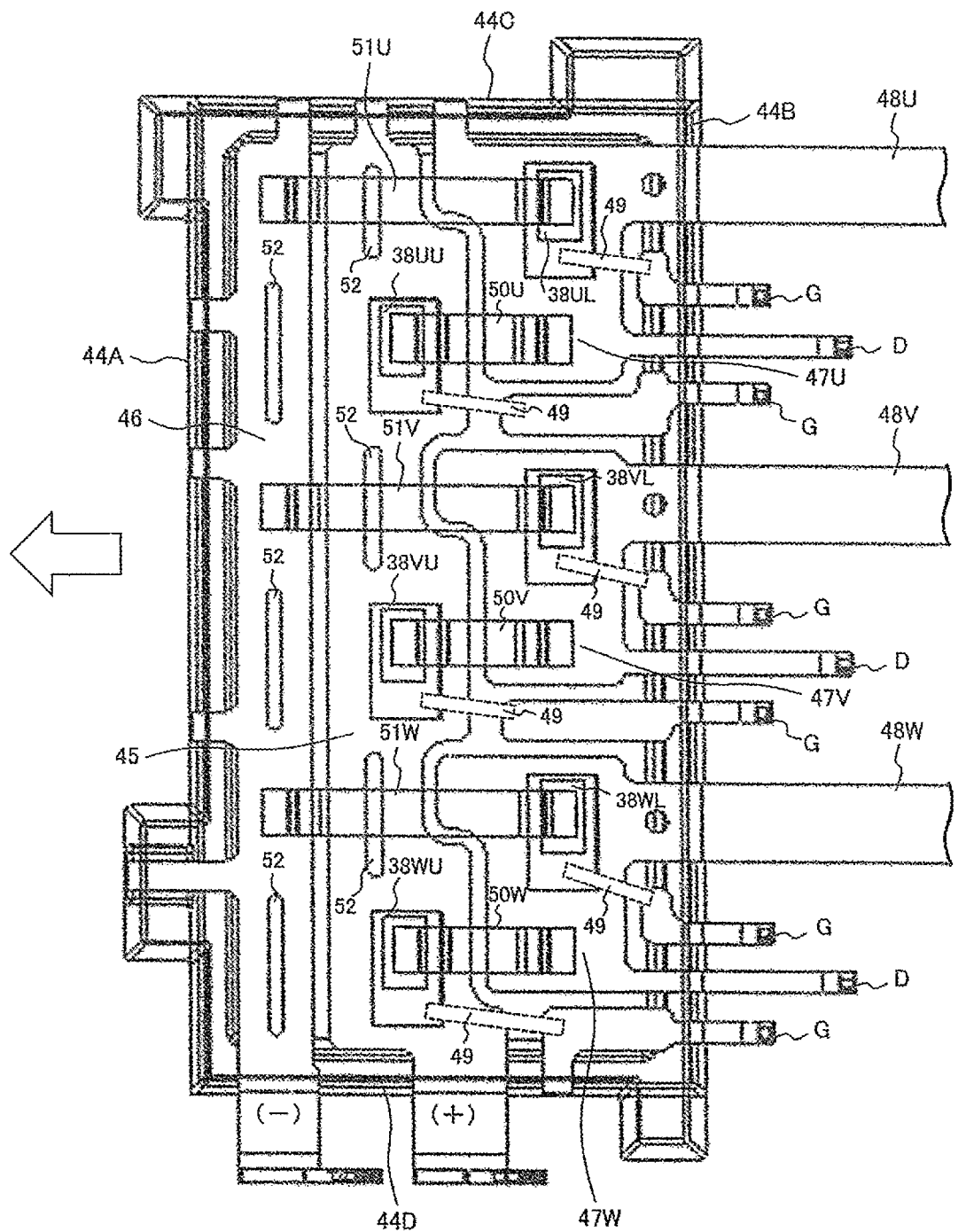
FIG. 12 is a drawing for explaining arrangement of metal wiring boards and power switching elements of the one power conversion circuit unit of the redundant system.

In the following description, a configuration of the electric power steering device according to the embodiment of the present invention will be explained in detail with reference to FIGS. 2 to 12. FIG. 2 is a drawing showing a general configuration of the electric power steering device according to the present embodiment. FIG. 3 is a drawing, viewed from an oblique direction, with components of the electric power steering device shown in FIG. 2 dismantled. FIGS. 4 to 9 are drawings showing assembly states of components that are assembled in an assembly order. FIGS. 10 to 12 are drawings for explaining specific configurations that are features of the present embodiment. The embodiment will be explained below with reference to the drawings.

As shown in FIG. 2, an electric motor unit 8 forming the electric power steering device is configured by a motor housing 11 having a cylindrical portion made of aluminum alloy etc. and an electric motor (not shown) accommodated in the motor housing 11. An electronic control unit 9 is configured by a metal cover 12 made of aluminum alloy etc. and located at an opposite side to an output shaft of the electric motor in an axial direction of the motor housing 11 and an electronic control unit (not shown) accommodated in this metal cover 12.

The motor housing 11 and the metal cover 12 are fixedly connected to each other at their opposing end surfaces with an adhesive or fixing bolts or by welding. The electronic control unit accommodated in an inside accommodation space of the metal cover 12 is configured by a power supply circuit unit that generates a required power, a power conversion circuit unit having a power switching element such as a MOSFET and an IGBT that drive and control the electric motor of the electric motor unit 8, and a control circuit unit that controls the power switching element. An output terminal of the power switching element and an input terminal of a coil of the electric motor are electrically connected through bus bars.

A connector terminal assembly 13 is fixed to an end surface of the metal cover 12 with fixing bolts. The connector terminal assembly 13 has a connector terminal forming portion 13A for power supply, a connector terminal forming portion 13B for detection sensors, and a connector terminal forming portion 13C for control state output by which a control state is outputted to an external device. The electronic control unit accommodated in the metal cover 12 is supplied with power from a power supply through the synthetic-resin-made connector terminal forming portion 13A for power supply. Further, the electronic control unit is provided with detection signals of an operating condition etc. from the detection sensors through the connector terminal forming portion 13B for detection sensors. A current control state signal of the electric power steering device is outputted from the electronic control unit through the connector terminal forming portion 13C for control state output.

FIG. 3 is a perspective exploded view of the electric power steering device 6. An iron-made annular side yoke (not shown) is fitted to an inside of a motor housing 11. The electric motor is accommodated inside this side yoke. An output shaft portion 14 of the electric motor provides the steering assistive force to the rack via the gear. Since a specific structure of the electric motor is well known, its explanation will be omitted here.

The motor housing 11 is made of aluminum alloy, and acts as a heat sink that accumulates heat generated at the electric motor and at after-mentioned power supply circuit unit and power conversion circuit unit by heat capacity of the heat sink itself then radiates or releases the heat to the outside atmosphere. The electric motor and the motor housing 11 form the electric motor unit 8.

The electronic control unit EC is connected to a side end wall 15 of the motor housing 11 which is an opposite side to the output shaft portion 14 of the electric motor unit 8. The electronic control unit EC has the power conversion circuit unit 16, the power supply circuit unit 17 and the control circuit unit 18. The side end wall 15 of the motor housing 11 is formed integrally with the motor housing 11. However, the side end wall 15 could be formed separately from the motor housing 11, then fixed to the motor housing 11 with bolts or by welding.

Here, the power conversion circuit unit 16, the power supply circuit unit 17 and the control circuit unit 18 form a redundant system (a dual-redundancy system) by a main electronic control unit and a sub-electronic control unit. In a normal condition, the electric motor is driven and controlled by the main electronic control unit. However, if an abnormal condition or a failure occurs at the main electronic control unit, the control is switched to the sub-electronic control unit, and the electric motor is driven and controlled by the sub-electronic control unit.

Therefore, normally, heat from the main electronic control unit is transmitted to the motor housing 11. If the abnormal condition or the failure occurs at the main electronic control unit, the main electronic control unit stops and the sub-electronic control unit operates, then heat from the sub-electronic control unit is transmitted to the motor housing 11.

As another redundant system, both of the main electronic control unit and the sub-electronic control unit could operate as a regular electronic control unit. Then, if the abnormal condition or the failure occurs at one of the electronic control units, the other electronic control unit drives and controls the electric motor by half ability. In this case, although capability of the electric motor is half, a steering function is secured. It is noted that even if no redundant system is employed, the present embodiment can be realized.

The electronic control unit EC is configured by the power conversion circuit unit 16, the power supply circuit unit 17, the control circuit unit 18 and the connector terminal assembly 13. These power conversion circuit unit 16, power supply circuit unit 17, control circuit unit 18 and connector terminal assembly 13 are arranged in this order from the side end wall 15 side to a direction moving away from the side end wall 15. The control circuit unit 18 is a unit that generates a control signal for driving the power switching element of the power conversion circuit unit 16, and is configured by a microcomputer and a peripheral circuit and so on. The power supply circuit unit 17 is a unit that generates power to drive the control circuit unit 18 and power for the power conversion circuit unit 16, and is configured by a capacitor, a coil and a switching element and so on. The power conversion circuit unit 16 is a unit that controls power (current) flowing in the three-phase coil of the electric motor, and is configured by the power switching elements that form three-phase upper and lower arms and so on.

A unit having a large heat value in the electronic control unit EC is mainly the power conversion circuit unit 16 and the power supply circuit unit 17. Heat of the power conversion circuit unit 16 and the power supply circuit unit 17 is released from the motor housing 11 made of aluminum alloy.

The synthetic-resin-made connector terminal assembly 13 is arranged between the control circuit unit 18 and the metal cover 12, and is connected to a vehicle battery (the power supply) and other external control device (not shown) to which the current control state of the electric power steering device is outputted. Needless to say, the connector terminal assembly 13 is connected to the power conversion circuit unit 16, the power supply circuit unit 17 and the control circuit unit 18.

The metal cover 12 has a function of accommodating and liquid-tightly sealing the power conversion circuit unit 16, the power supply circuit unit 17 and the control circuit unit 18. In the present embodiment, the metal cover 12 is fixed to the motor housing 11 by welding. Since the metal cover 12 is made of metal, the metal cover 12 also has a function of radiating or releasing heat generated at the power conversion circuit unit 16 and the power supply circuit unit 17 etc. to the outside.

Figure 4:
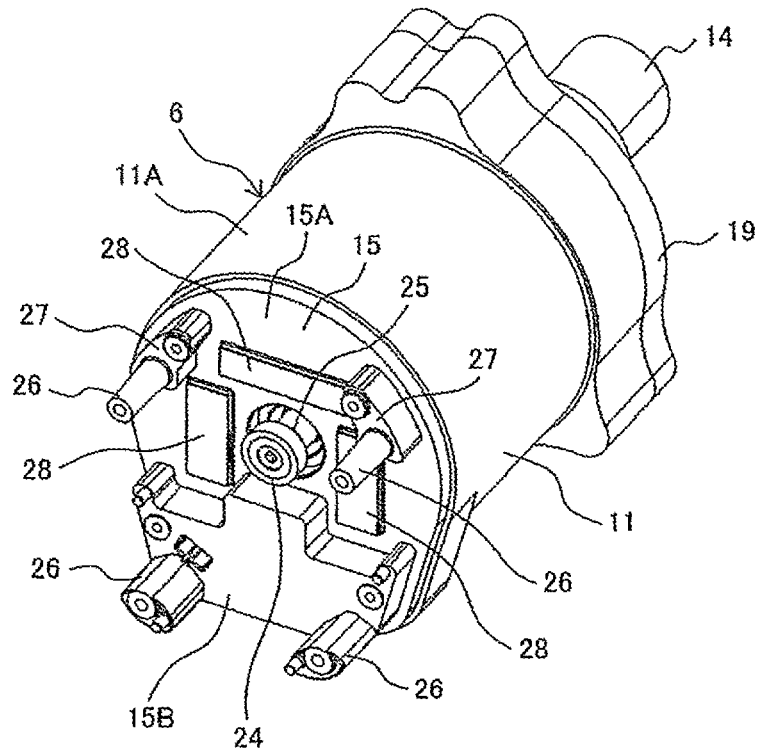
FIG. 4 is a perspective view of a motor housing shown in FIG. 3.
Figure 5:
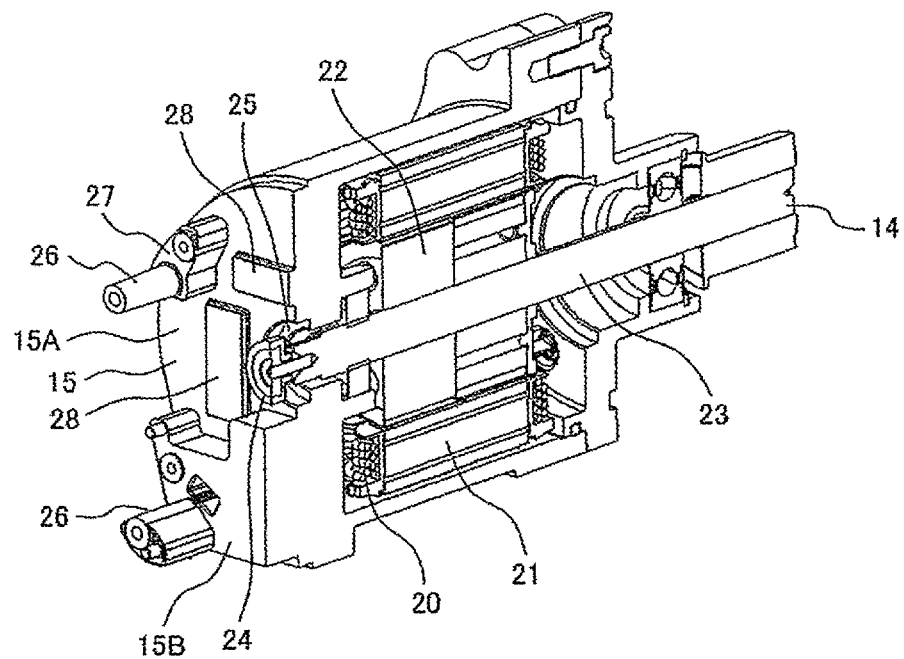
FIG. 5 is a cross section of the motor housing shown in FIG. 4, which is cut in an axial direction of the motor housing.

Next, structure or configuration of each component and an assembling method of the components will be explained with reference to FIGS. 4 to 9. FIG. 4 is an external view of the motor housing 11. FIG. 5 is a cross section of the motor housing 11, which is cut in an axial direction of the motor housing 11.

In FIGS. 4 and 5, the motor housing 11 is shaped into a cylindrical or tubular shape. The motor housing 11 has a side peripheral surface portion 11A, the side end wall 15 that closes one end of the side peripheral surface portion 11A and a side end wall 19 that closes the other end of the side peripheral surface portion 11A. In the present embodiment, the side peripheral surface portion 11A and the side end wall 15 are formed integrally with each other, then the motor housing 11 has a bottomed cylindrical shape. The side end wall 19 serves as a lid, and closes the other end of the side peripheral surface portion 11A after accommodating the electric motor in the side peripheral surface portion 11A.

As shown in FIG. 5, a stator 21 having cores around which coil 20 is wound is fitted in the side peripheral surface portion 11A, and a rotor 22 in which a permanent magnet is embedded is rotatably accommodated inside this stator 21. A rotation shaft 23 is fixed to the rotor 22, and its one end is the output shaft portion 14, and its other end is a rotation detection portion 24 for detecting a rotation phase and a rotation speed of the rotation shaft 23. The rotation detection portion 24 is provided with a permanent magnet, and protrudes to the outside through a penetration hole 25 formed at the side end wall 15. The rotation phase and the rotation speed of the rotation shaft 23 are detected by a magnetism detecting portion configured by a GMR element (not shown) etc.

Returning to FIG. 4, heat radiating sections (heat releasing sections) 15A and 15B for the power conversion circuit unit 16 and the power supply circuit unit 17 are formed on a surface of the side end wall 15 located at an opposite side to the output shaft portion 14 of the rotation shaft 23. Further, the circuit board fixing portions 26 are formed integrally with the side end wall 15 at four corners of the side end wall 15 so as to stand on or protrude from the surface of the side end wall 15. Each circuit board fixing portion 26 has a screw hole inside the circuit board fixing portion 26. The circuit board fixing portion 26 is provided to secure an after-mentioned glass epoxy circuit board 34 of the control circuit unit 18, and has a function of releasing (or transmitting) heat of the circuit board of the control circuit unit 18 to the motor housing 11.

The circuit board fixing portions 26 protruding from the power-conversion-circuit heat releasing section 15A (described later) each have a circuit board receiving portion 27 whose height in the axial direction is the same as that of the power-supply-circuit heat releasing section 15B (described later). This circuit board receiving portion 27 is a portion on which an after-mentioned glass epoxy circuit board 31 of the power supply circuit unit 17 is mounted.

As can be seen from FIG. 4, a plane area forming the side end wall 15, which is orthogonal to the rotation shaft 23, is sectioned off into two sections. One is the power-conversion-circuit heat releasing section 15A to which the power conversion circuit unit 16 is fixed, and the other is the power-supply-circuit heat releasing section 15B to which the power supply circuit unit 17 is fixed. In the present embodiment, an area of the power-conversion-circuit heat releasing section 15A is greater than that of the power-supply-circuit heat releasing section 15B. This is because the redundant system is employed as described above and a mounting area of the power conversion circuit unit 16 is secured.

Here, coil input terminal leading openings are formed on the power-conversion-circuit heat releasing section 15A, although which are not shown in the drawings. And, the input terminals of the three-phase coil of the electric motor to which after-mentioned control output terminals of the power conversion circuit unit 16 are connected are drawn out from these coil input terminal leading openings. These three-phase coil input terminals are arranged so as to face an after-mentioned control output terminal-side line 44B (see FIG. 12) of the power conversion circuit unit 16.

Further, a different height step in the axial direction (a direction in which the rotation shaft 23 extends) is provided between the power-conversion-circuit heat releasing section 15A and the power-supply-circuit heat releasing section 15B. That is, the power-supply-circuit heat releasing section 15B is formed so as to have a step that is away from the power-conversion-circuit heat releasing section 15A in the direction of the rotation shaft 23 of the electric motor. This step is set to such a height that the power conversion circuit unit 16 and the power supply circuit unit 17 do not interfere with each other when the power supply circuit unit 17 is mounted after the power conversion circuit unit 16 is mounted.

The power-conversion-circuit heat releasing section 15A is provided with three long narrow rectangular protruding heat releasing portions 28. These protruding heat releasing portions 28 are portions on which the power conversion circuit unit 16 for the redundant system is mounted. The protruding heat releasing portions 28 protrude from the surface of the power-conversion-circuit heat releasing section 15A in the direction of the rotation shaft 23 of the electric motor so as to be away from the electric motor.

Figure 6:
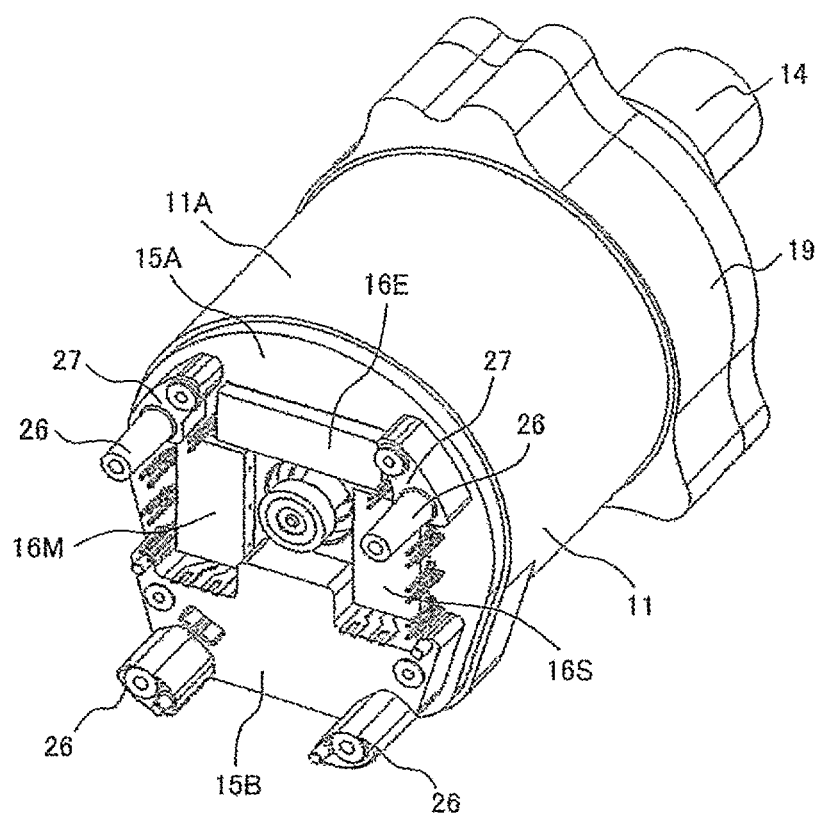
FIG. 6 is a perspective view of the motor housing shown in FIG. 4 with a power conversion circuit unit mounted on the motor housing.

These protruding heat releasing portions 28 are formed into rectangular shapes according to respective shapes of a main power conversion circuit unit 16M, a sub-power conversion circuit unit 16S and an abnormality response circuit unit 16E, as shown in FIG. 6. Further, one long side of each protruding heat releasing portion 28 (each of the units 16M, 16S and 16E) faces toward the rotation shaft 23, and the other long side of each protruding heat releasing portion 28 (each of the units 16M, 16S and 16E) faces toward aforementioned three-phase coil input terminals.

The power-supply-circuit heat releasing section 15B is formed into a flat surface, and the power supply circuit unit 17 is mounted on the power-supply-circuit heat releasing section 15B. Therefore, the protruding heat releasing portion 28 acts as a heat releasing portion that releases and transmits heat generated at the power conversion circuit unit 16 to the side end wall 15, and the power-supply-circuit heat releasing section 15B acts as a heat releasing portion that releases and transmits heat generated at the power supply circuit unit 17 to the side end wall 15. The protruding heat releasing portions 28 might be removed. In this case, the power-conversion-circuit heat releasing section 15A acts as the heat releasing portion that releases and transmits heat generated at the power conversion circuit unit 16 to the side end wall 15.

As described above, in the present embodiment, since the side end wall 15 of the motor housing 11 acts as a heat sink member, a separately-formed heat sink member is not needed, then a length in the axial direction can be shortened. Further, since the motor housing 11 has a sufficient heat capacity, it is possible to efficiently radiate or release heat of the power supply circuit unit 17 and the power conversion circuit unit 16 to the outside from the motor housing 11.

Next, FIG. 6 shows a state in which the power conversion circuit unit 16 is mounted on the protruding heat releasing portions 28. As shown in FIG. 6, the power conversion circuit unit 16 forming the redundant system is mounted on the protruding heat releasing portions 28 formed on the power-conversion-circuit heat releasing section 15A. The power conversion circuit unit 16 is configured by the main power conversion circuit unit 16M, the sub-power conversion circuit unit 16S and the abnormality response circuit unit 16E. And, each or all of the units 16M, 16S and 16E including the power switching elements and metal wiring boards, which form the unit, is packaged with synthetic resin. This detailed explanation will be made later with reference to FIGS. 10 to 12.

Thus, the power conversion circuit unit 16 is thermally connected to the protruding heat releasing portion 28. With this configuration, heat generated at the power switching element can be efficiently transmitted to the protruding heat releasing portion 28. A heat transfer grease (or a thermal conductive grease) is applied between the power conversion circuit unit 16 and the protruding heat releasing portion 28, which facilitates heat transmission from the power conversion circuit unit 16 to the protruding heat releasing portion 28. Further, the power conversion circuit unit 16 is pressed and held toward the protruding heat releasing portion 28 side by an elastic function member of a power conversion circuit unit fixing member which is attached to an end portion of the rotation shaft 23.

Heat transmitted to the protruding heat releasing portion 28 diffuses through the power-conversion-circuit heat releasing section 15A, and is further transmitted to the side peripheral surface portion 11A of the motor housing 11, then is released to the outside. Here, as mentioned above, since a height of the power-conversion-circuit heat releasing section 15A in the axial direction is lower than that of the power-supply-circuit heat releasing section 15B, the power conversion circuit unit 16 does not interfere with the power supply circuit unit 17.

Figure 7:
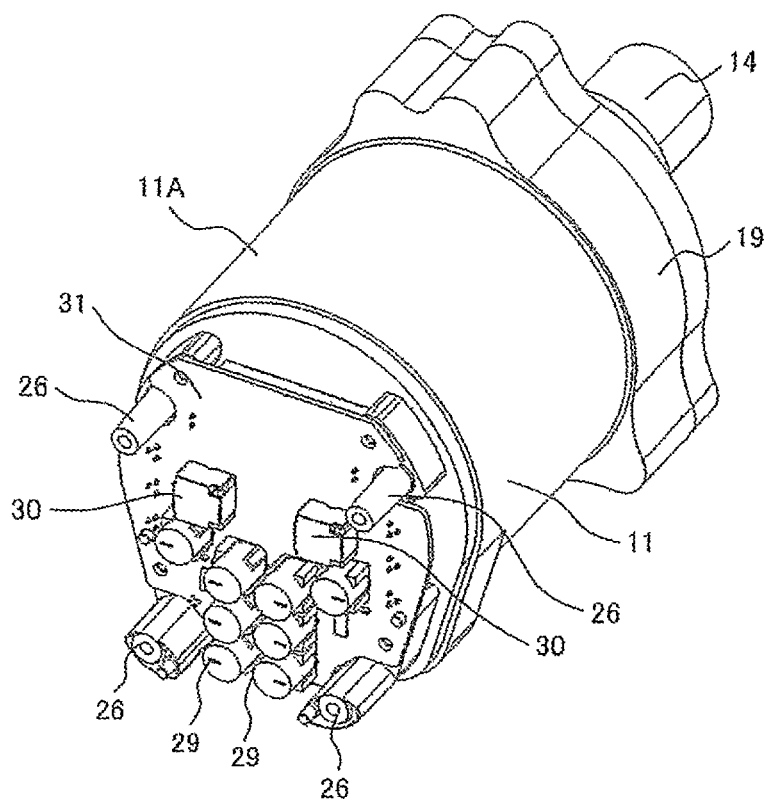
FIG. 7 is a perspective view of the motor housing shown in FIG. 4 with a power supply circuit unit further mounted on the motor housing.

Next, FIG. 7 shows a state in which the power supply circuit unit 17 is mounted above or over the power conversion circuit unit 16. As shown in FIG. 7, the power supply circuit unit 17 is mounted on the power-supply-circuit heat releasing section 15B. Capacitors 29 and coils 30 and so on which form the power supply circuit unit 17 are mounted on the glass epoxy circuit board 31. The power supply circuit unit 17 has the redundant system, and as can be seen from the drawings, power supply circuits configured by the capacitors 29 and the coils 30 etc., which are arranged symmetrically with respect to each other, are provided.

A surface at the power-supply-circuit heat releasing section 15B side of this glass epoxy circuit board 31 is fixed to the side end wall 15 so as to contact the power-supply-circuit heat releasing section 15B. As a fixing manner, as shown in FIG. 7, the glass epoxy circuit board 31 is fixed to the screw holes provided at the circuit board receiving portions 27 of the circuit board fixing portions 26 with fixing bolts (not shown), and also fixed to the screw holes provided at the power-supply-circuit heat releasing section 15B with fixing bolts (not shown).

Here, since the power supply circuit unit 17 is formed by the glass epoxy circuit board 31, the circuit units could be mounted on both sides of the glass epoxy circuit board 31. On the surface at the power-supply-circuit heat releasing section 15B side of the glass epoxy circuit board 31, the GMR element (not shown) or a rotation phase and rotation speed detection unit that is configured by a detection circuit formed by the GMR element is mounted, and detects the rotation phase and the rotation speed of the rotation shaft 23 in cooperation with the rotation detection portion 24 provided at the rotation shaft 23.

As described above, since the glass epoxy circuit board 31 is fixed to the side end wall 15 so as to contact the power-supply-circuit heat releasing section 15B, it is possible to efficiently transmit heat generated at the power supply circuit unit 17 to the power-supply-circuit heat releasing section 15B. Heat transmitted to the power-supply-circuit heat releasing section 15B is further transmitted to and diffuses through the side peripheral surface portion 11A of the motor housing 11, then is released to the outside. Here, by interposing one of a good heat transfer adhesive (or a good thermal conductive adhesive), a heat transfer grease (or a thermal conductive grease) and a heat transfer sheet (or a thermal conductive sheet) between the glass epoxy circuit board 31 and the power-supply-circuit heat releasing section 15B, a heat transfer performance (or a thermal conductivity) can be further improved.

Figure 8:
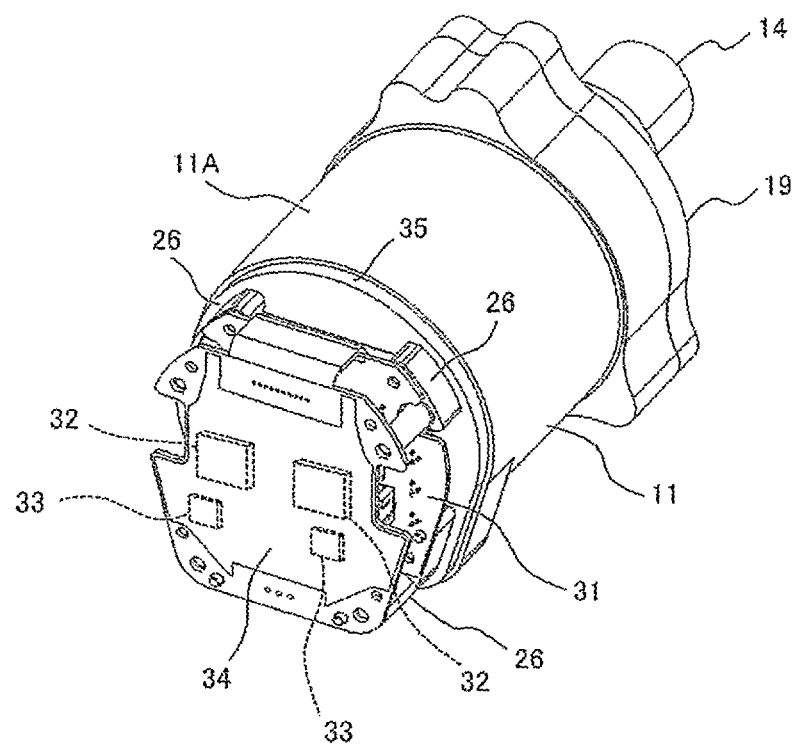
FIG. 8 is a perspective view of the motor housing shown in FIG. 4 with a control circuit unit further mounted on the motor housing.

Next, FIG. 8 shows a state in which the control circuit unit 18 is mounted above or over the power supply circuit unit 17. As shown in FIG. 8, the control circuit unit 18 is mounted above or over the power supply circuit unit 17. Microcomputers 32 and peripheral circuits 33 which form the control circuit unit 18 are mounted on the glass epoxy circuit board 34. The control circuit unit 18 also has the redundant system, and as can be seen from the drawings, control circuits configured by the microcomputers 32 and the peripheral circuits 33 such as transistors, which are arranged symmetrically with respect to each other, are provided. The microcomputers 32 and the peripheral circuits 33 are mounted on a surface at the power supply circuit unit 17 side of the glass epoxy circuit board 34.

This glass epoxy circuit board 34 is fixed to the bolt holes provided at tops of the circuit board fixing portions 26 with fixing bolts (not shown), as shown in FIG. 8, then a space in which the capacitors 29 and the coils 30 etc. of the power supply circuit unit 17 shown in FIG. 7 are arranged is provided between the glass epoxy circuit board 31 of the power supply circuit unit 17 and the glass epoxy circuit board 34 of the control circuit unit 18.

Figure 9:
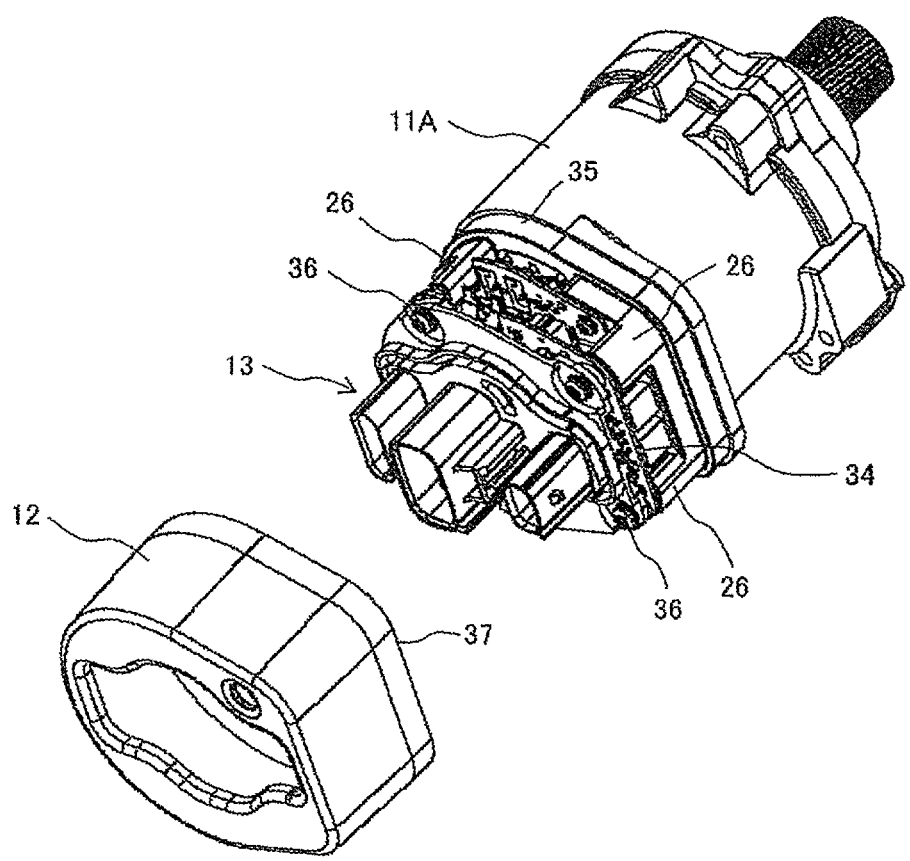
FIG. 9 is a perspective view of the motor housing shown in FIG. 4 and a metal cover that is going to be fixed to the motor housing.

Next, FIG. 9 shows a state in which the connector terminal assembly 13 is mounted above or over the control circuit unit 18. As shown in FIG. 9, the connector terminal assembly 13 is mounted above or over the control circuit unit 18. The connector terminal assembly 13 is fixed to screw holes provided at tops of board fixing portions 26A and 26B with fixing screws 36 so as to sandwich the control circuit unit 18 between the power supply circuit unit 17 and the connector terminal assembly 13. In this state, as shown in FIG. 3, the connector terminal assembly 13 is connected to the power conversion circuit unit 16, the power supply circuit unit 17 and the control circuit unit 18. Further, after fixing the connector terminal assembly 13, an opening end 37 of the metal cover 12 is connected to a stepped portion 35 of the motor housing 11, and fixed to the motor housing 11 by welding.

Next, the power conversion circuit unit 16 of the present embodiment will be explained with reference to FIGS. 10 to 12. FIG. 10 is a circuit diagram showing a circuit configuration of the power conversion circuit unit 16 forming a redundant system. FIG. 11 is a drawing schematically showing a cross section of one power conversion circuit unit of the redundant system. FIG. 12 is a drawing showing arrangement of metal wiring boards and power switching elements of the one power conversion circuit unit of the redundant system.

The circuit shown in FIG. 10 is a circuit of the redundant system in which both of the main electronic control unit and the sub-electronic control unit operate as a regular electronic control unit, and if the abnormal condition or the failure occurs at one of the electronic control units, the other electronic control unit drives and controls the electric motor by half ability. In this case, although capability of the electric motor is half, a steering function is secured. Here, the coil 20 of the electric motor is formed by a U-phase main coil UM, a V-phase main coil VM, a W-phase main coil WM, a U-phase sub-coil US, a V-phase sub-coil VS and a W-phase sub-coil WS.

The U-phase main coil UM, the V-phase main coil VM and the W-phase main coil WM are controlled by the main power conversion circuit unit 16M. The U-phase sub-coil US, the V-phase sub-coil VS and the W-phase sub-coil WS are controlled by the sub-power conversion circuit unit 16S. A circuit configuration of the main power conversion circuit unit 16M and that of the sub-power conversion circuit unit 16S are the same, and these power conversion circuit units 16M and 16S share an operation of the coil 20 fifty-fifty.

The power conversion circuit unit 16 has the power switching elements that form upper and lower arms for each of the U-phase, the V-phase and the W-phase. At the U-phase side, a pair of an upper arm power switching element 38UU and a lower arm power switching element 38UL are connected in series, and its midpoint is connected to the U-phase main coil UM. At the V-phase side, a pair of an upper arm power switching element 38VU and a lower arm power switching element 38VL are connected in series, and its midpoint is connected to the V-phase main coil VM. At the W-phase side, a pair of an upper arm power switching element 38WU and a lower arm power switching element 38WL are connected in series, and its midpoint is connected to the W-phase main coil WM.

Likewise, the sub-power conversion circuit unit 16S has the power switching elements that form upper and lower arms for each of the U-phase, the V-phase and the W-phase. At the U-phase side, a pair of an upper arm power switching element 39UU and a lower arm power switching element 39UL are connected in series, and its midpoint is connected to the U-phase sub-coil US. At the V-phase side, a pair of an upper arm power switching element 39VU and a lower arm power switching element 39VL are connected in series, and its midpoint is connected to the V-phase sub-coil VS. At the W-phase side, a pair of an upper arm power switching element 39WU and a lower arm power switching element 39WL are connected in series, and its midpoint is connected to the W-phase sub-coil WS.

Further, the upper arm power switching elements 38UU, 38VU and 38WU of the main power conversion circuit unit 16M and the upper arm power switching elements 39UU, 39VU and 39WU of the sub-power conversion circuit unit 16S are each connected to a power supply line BL. On the other hand, the lower arm power switching elements 38UL, 38VL and 38WL of the main power conversion circuit unit 16M and the lower arm power switching elements 39UL, 39VL and 39WL of the sub-power conversion circuit unit 16S are each connected to an earth line EL.

Each operation of the main power conversion circuit unit 16M and the sub-power conversion circuit unit 16S is substantially the same as that of a typical power conversion circuit unit. Therefore, its detailed explanation is omitted here.

The abnormality response circuit unit 16E also has a main side and a sub-side, and the U-phase main coil UM, the V-phase main coil VM and the W-phase main coil WM are connected to respective neutral point relay switching elements 40M of the abnormality response circuit unit 16E, also the U-phase sub-coil US, the V-phase sub-coil VS and the W-phase sub-coil WS are connected to respective neutral point relay switching elements 40S of the abnormality response circuit unit 16E. Therefore, if the abnormal condition or the failure occurs at one of the electronic control units, one of the neutral point relay switching elements 40M and 40S, which is the abnormal condition occurrence side or the failure occurrence side, is turned off, and flow of current is stopped in response to the occurrence of the abnormal condition or the failure.

FIG. 11 is a drawing schematically showing a cross section of the main power conversion circuit unit 16M. The main power conversion circuit unit 16M packaged with synthetic resin 43 is mounted on an upper surface of the protruding heat releasing portion 28 of the side end wall 15 of the motor housing 11. The main power conversion circuit unit 16M is not mounted on a board, but merely molded with the synthetic resin. With this, a thickness in a height direction of the main power conversion circuit unit 16M is thinner, then reduction in size and in parts count can be achieved.

A metal wiring board 41 as a wiring pattern is arranged in the synthetic resin 43, and the power switching element 38 is placed on the wiring board 41 and electrically connected to the wiring board 41. Further, a clip 42 of a jumper wire is placed on the power switching element 38 and electrically connected to the power switching element 38. Although FIG. 11 shows the cross section of one of the power switching elements 38, the other power switching elements 38 have the same configuration. The sub-power conversion circuit unit 16S and the abnormality response circuit unit 16E also has substantially the same configuration.

FIG. 12 is a drawing showing arrangement of the metal wiring boards and the power switching elements of the main power conversion circuit unit 16M. The main power conversion circuit unit 16M is a unit formed by arranging the metal wiring boards and the power switching elements at predetermined positions and integrally molding them with the synthetic resin 43. In FIG. 12, the synthetic resin 43 with which the metal wiring boards and the power switching elements are molded is transparent to visualize the metal wiring boards and the power switching elements.

In FIG. 12, the main power conversion circuit unit 16M is integrally molded with the synthetic resin 43, and formed into a substantially rectangular shape. One long side (hereinafter, called a rotation shaft-side line) 44A faces toward the rotation shaft 23, and the other long side (hereinafter, called the control output terminal-side line) 44B faces toward the three-phase coil input terminals of the electric motor. These rotation shaft-side line 44A and control output terminal-side line 44B are parallel to each other, and the main power conversion circuit unit 16M is shaped or defined by the rotation shaft-side line 44A, the control output terminal-side line 44B and side lines 44C and 44D that connect both end portions of the rotation shaft-side line 44A and the control output terminal-side line 44B.

The metal wiring board includes a long narrow power supply wiring board 45 functioning as the power supply line BL, a long narrow earth wiring board 46 being adjacent to the power supply wiring board 45 and functioning as the earth line EL and separately-arranged three control wiring boards 47U, 47V and 47W each being adjacent to the power supply wiring board 45 and functioning as a control line. The earth wiring board 46 is arranged so as to extend in a longitudinal direction along the rotation shaft-side line 44A, and earthed to end surfaces of the rotation shaft-side line 44A. The three control wiring boards 47U, 47V and 47W each extend in the longitudinal direction along the control output terminal-side line 44B, and are arranged at regular intervals. The power supply wiring board 45 is arranged so as to extend in the longitudinal direction along the rotation shaft-side line 44A at a substantially middle between the three control wiring boards 47U, 47V and 47W and the earth wiring board 46, and connected to a power supply at end surfaces of the rotation shaft-side line 44A.

The upper arm power switching elements 38UU, 38VU and 38WU are arranged at regular intervals on an upper surface of the power supply wiring board 45. The lower arm power switching elements 38UL, 38VL and 38WL are arranged at regular intervals on an upper surface of the three control wiring boards 47U, 47V and 47W respectively.

Here, the upper arm power switching elements 38UU, 38VU and 38WU and the lower arm power switching elements 38UL, 38VL and 38WL are arranged in a zigzag formation (a staggered arrangement) in the longitudinal direction (in directions of the rotation shaft-side line 44A and the control output terminal-side line 44B) such that the lower arm power switching elements 38UL, 38VL and 38WL are positioned between the upper arm power switching elements 38UU, 38VU and 38WU respectively (the power switching elements 38UU, 38VU, 38WU, 38UL, 38VL and 38WL are staggered) with a line of the upper arm power switching elements 38UU, 38VU and 38WU and a line of the lower arm power switching elements 38UL, 38VL and 38WL spaced a predetermined distance.

A U-phase control output terminal 48U, a V-phase control output terminal 48V and a W-phase control output terminal 48W connected to the U-phase main coil UM, the V-phase main coil VM and the W-phase main coil WM are formed integrally with the three control wiring boards 47U, 47V and 47W extending in the longitudinal direction along the control output terminal-side line 44B and arranged at regular intervals, respectively.

Further, a gate terminal G and a drain terminal D for each power switching element 38 of the three phases of the upper and lower arms are formed at a side of the control output terminal-side line 44B with the gate terminal G and the drain terminal D being adjacent to the U-phase control output terminal 48U, the V-phase control output terminal 48V and the W-phase control output terminal 48W. The gate terminals G for the three phases are connected to gates of the respective power switching elements 38 of the upper and lower arms through connecting wirings 49.

The upper arm power switching elements 38UU, 38VU and 38WU on the power supply wiring board 45 are connected to the corresponding three control wiring boards 47U, 47V and 47W through jumper wires 50U, 50V and 50W. Likewise, the lower arm power switching elements 38UL, 38VL and 38WL on the three control wiring boards 47U, 47V and 47W are connected to the earth wiring board 46 through jumper wires 51U, 51V and 51W.

In this manner, the three-phase control output terminals 48U, 48V and 48W connected to the coil input terminals are formed at the control output terminal-side line 44B, and the power switching elements 38UU, 38VU, 38WU, 38UL, 38VL and 38WL forming the upper and lower arms for each phase are arranged along the control output terminal-side line 44B with these power switching elements 38UU, 38VU, 38WU, 38UL, 38VL and 38WL being offset from a substantially middle between the rotation shaft-side line 44A and the control output terminal-side line 44B toward the control output terminal-side line 44B.

With this arrangement, a length of each wire connecting the power switching elements 38UU, 38VU, 38WU, 38UL, 38VL and 38WL forming the upper and lower arms and the control output terminals 48U, 48V and 48W can be shortened, thereby reducing the size of the power conversion circuit unit. Further, since the wire length can be shortened, increase in impedance can be suppressed.

Further, in the present embodiment, the upper arm power switching elements 38UU, 38VU and 38WU and the lower arm power switching elements 38UL, 38VL and 38WL are arranged in the zigzag formation (the staggered arrangement) in the longitudinal direction such that the lower arm power switching elements 38UL, 38VL and 38WL are positioned between the upper arm power switching elements 38UU, 38VU and 38WU respectively (the power switching elements 38UU, 38VU, 38WU, 38UL, 38VL and 38WL are staggered).

Therefore, the power supply wiring board 45 can be formed into a shape that protrudes toward the control wiring board 47U, 47V and 47W sides. Conversely, the control wiring boards 47U, 47V and 47W have shapes that retract in accordance with (or, so as to fit to) the protrusion of the shape of the power supply wiring board 45. Likewise, the control wiring boards 47U, 47V and 47W can be formed into shapes that protrude toward the power supply wiring board 45 side. Conversely, the power supply wiring board 45 has a shape that retracts in accordance with (or, so as to fit to) the protrusions of the shapes of the control wiring boards 47U, 47V and 47W. In this manner, each heat releasing area (each heat radiating area) of the power supply wiring board 45 and the control wiring boards 47U, 47V and 47W can be large by these protruding shapes. Hence, it is possible to efficiently release heat to the protruding heat releasing portion 28 shown in FIG. 11.

In addition, the upper arm power switching elements 38UU, 38VU and 38WU and the lower arm power switching elements 38UL, 38VL and 38WL can be arranged close to each other, then each length of the jumper wires 50U, 50V and 50W and the jumper wires 51U, 51V and 51W can be further shortened.

Furthermore, resin flow openings 52 are formed at sections of the power supply wiring board 45 and the earth wiring board 46 molded with the synthetic resin 43. By providing these resin flow openings 52, good molding of both surfaces of each of the power supply wiring board 45 and the earth wiring board 46 can be achieved. Here, if these resin flow openings 52 are provided at sections where the jumper wires 51U, 51V and 51W are placed, good molding of both surfaces of each of the jumper wires 51U, 51V and 51W can also be achieved. Additionally, since the jumper wires 51U, 51V and 51W and the resin flow openings 52 overlap each other, an area, viewed from above, of the power conversion circuit unit becomes small, thereby bringing about an effect of reducing the whole size of the power conversion circuit unit.

As described above, the power conversion circuit unit defined by the rotation shaft-side line formed so as to face toward the rotation shaft of the electric motor, the control output terminal-side line formed so as to face toward the three-phase coil input terminals of the electric motor and the side lines connecting the both end portions of the rotation shaft-side line and the control output terminal-side line is formed and packaged with the synthetic resin, and the three-phase control output terminals connected to the three-phase coil input terminals are formed at the control output terminal-side line, and the power switching elements forming the upper and lower arms for each phase are arranged in the zigzag formation along the control output terminal-side line with the power switching elements being offset from a substantially middle between the rotation shaft-side line and the control output terminal-side line toward the control output terminal-side line.

According to this configuration, since the power switching elements forming the upper and lower arms for each phase are arranged along the control output terminal-side line with the power switching elements being offset from a substantially middle between the rotation shaft-side line and the control output terminal-side line toward the control output terminal-side line, a length of each wire connecting the power switching elements forming the upper and lower arms and the control output terminals can be shortened, thereby reducing a size of the power conversion circuit unit. Further, since the power switching elements forming the upper and lower arms are arranged in the zigzag formation (the staggered arrangement), an area of the metal wiring board can be increased, then a heat releasing performance can be improved by this increased area.

The present invention is not limited to the above embodiment, and includes all design modifications. The above embodiment is an embodiment that is explained in detail to easily understand the present invention, and the present invention is not necessarily limited to the embodiment having all elements or components described above. Further, a part of the configuration of the embodiment can be replaced with a configuration of other embodiments. Also, the configuration of other embodiments could be added to the configuration of the embodiment. Moreover, regarding a part of the configuration of the embodiment, the configuration of other embodiments could be added, removed and replaced.

EXPLANATION OF REFERENCE

6 . . . electric power steering device, 8 . . . electric motor unit, 9 . . . electronic control unit, 11 . . . motor housing, 12 . . . metal cover, 13 . . . connector terminal assembly, 14 . . . output shaft portion, 15 . . . side end wall, 16 . . . power conversion circuit unit, 17 . . . power supply circuit unit, 18 . . . control circuit unit, 19 . . . side end wall, 20 . . . coil, 21 . . . stator, 22 . . . rotor, 23 . . . rotation shaft, 24 . . . rotation detection portion, 25 . . . penetration hole, 26 . . . circuit board fixing portion, 27 . . . circuit board receiving portion, 28 . . . protruding heat releasing portion, 29 . . . capacitor, 30 . . . coil, 31 . . . glass epoxy circuit board, 32 . . . microcomputer, 33 . . . peripheral circuit, 34 . . . glass epoxy circuit board, 35 . . . stepped portion, 36 . . . fixing screw, 37 . . . opening end, 38UU, 38VU, 38WU, 39UU, 39VU and 39WU . . . upper arm power switching elements, 38UL, 38VL, 38WL, 39UL, 39VL and 39WL . . . lower arm power switching elements, 40M and 40S . . . neutral point relay switching element, 41 . . . metal wiring board, 42 . . . clip, 43 . . . synthetic resin, 44A . . . rotation shaft-side line, 44B . . . control output terminal-side line, 45 . . . power supply wiring board, 46 . . . earth wiring board, 47U, 47V and 47W . . . control wiring boards, 48U, 48V and 48W . . . control output terminals, 50U, 50V and 50W, 51U, 51V and 51W . . . jumper wires

The invention claimed is:

1. An electric drive device comprising:
a motor housing accommodating therein an electric motor that drives a mechanical control element; and
an electronic control unit provided at a side end wall side of the motor housing which is an opposite side to an output shaft portion of a rotation shaft of the electric motor and having a control circuit unit, a power supply circuit unit and a power conversion circuit unit that are configured to drive the electric motor, and wherein
at least a power-conversion-circuit heat releasing section is formed at the side end wall of the motor housing, the power conversion circuit unit is mounted on the power-conversion-circuit heat releasing section, and heat generated at the power conversion circuit unit is released to the motor housing through the power-conversion-circuit heat releasing section,
the power conversion circuit unit is defined by a rotation shaft-side line formed so as to face toward the rotation shaft of the electric motor, a control output terminal-side line formed so as to face toward three-phase coil input terminals of the electric motor and being parallel to the rotation shaft-side line and side lines connecting both end portions of the rotation shaft-side line and the control output terminal-side line, and the power conversion circuit unit is packaged with synthetic resin, and three-phase control output terminals connected to the three-phase coil input terminals are formed at the control output terminal-side line, and power switching elements forming upper and lower arms for each phase are arranged in a zigzag formation along the control output terminal-side line with the power switching elements being offset from a substantially middle between the rotation shaft-side line and the control output terminal-side line toward the control output terminal-side line.

2. The electric drive device as claimed in claim 1, wherein:

the power conversion circuit unit has
a earth wiring board extending in a longitudinal direction and functioning as an earth line that is arranged along the rotation shaft-side line;
a power supply wiring board extending in the longitudinal direction while being adjacent to the earth wiring board and functioning as a power supply line; and
three control wiring boards separately arranged along the control output terminal-side line while being adjacent to the power supply wiring board and each functioning as a control line, wherein the three-phase control output terminals are formed at the three control wiring boards respectively,
three upper arm power switching elements forming the upper arm are arranged on the power supply wiring board, and three lower arm power switching elements forming the lower arm are arranged on the three control wiring boards respectively,
the three upper arm power switching elements and the three control wiring boards where the three lower arm power switching elements paired with the three upper arm power switching elements are arranged are connected through first jumper wires, and
the three lower arm power switching elements and the earth wiring board are connected through second jumper wires.

3. The electric drive device as claimed in claim 2, wherein:

the three upper arm power switching elements and the three lower arm power switching elements are arranged in the zigzag formation in a direction of the control output terminal-side line such that the lower arm power switching elements are positioned between the upper arm power switching elements respectively with a line of the upper arm power switching elements and a line of the lower arm power switching elements spaced a predetermined distance.

4. The electric drive device as claimed in claim 3, wherein:

the power supply wiring board is formed into such a shape as sections where the upper arm power switching elements are arranged protrude toward the control wiring board sides, conversely, the control wiring boards are formed into shapes that retract so as to fit to respective protrusions of the shape of the power supply wiring board, and the control wiring boards are formed into such shapes as sections where the lower arm power switching elements are arranged protrude toward the power supply wiring board side, conversely, the power supply wiring board is formed into a shape that retracts so as to fit to the respective protrusions of the shapes of the control wiring boards.

5. The electric drive device as claimed in claim 2, wherein:

a resin flow opening into which the synthetic resin flows is formed at a part of the earth wiring board and a part of the power supply wiring board.

6. An electric power steering device comprising:

an electric motor providing a steering assistive force to a steering shaft on the basis of an output from a torque sensor that detects a turning direction and a turning torque of the steering shaft;

a motor housing accommodating therein the electric motor; and an electronic control unit provided at a side end wall side of the motor housing which is an opposite side to an output shaft portion of a rotation shaft of the electric motor and having a control circuit unit, a power supply circuit unit and a power conversion circuit unit that are configured to drive the electric motor, and wherein at least a power-conversion-circuit heat releasing section is formed at the side end wall of the motor housing, the power conversion circuit unit is mounted on the power-conversion-circuit heat releasing section, and heat generated at the power conversion circuit unit is released to the motor housing through the power-conversion-circuit heat releasing section, the power conversion circuit unit is defined by a rotation shaft-side line formed so as to face toward the rotation shaft of the electric motor, a control output terminal-side line formed so as to face toward three-phase coil input terminals of the electric motor and being parallel to the rotation shaft-side line and side lines connecting both end portions of the rotation shaft-side line and the control output terminal-side line, and the power conversion circuit unit is packaged with synthetic resin, and three-phase control output terminals connected to the three-phase coil input terminals are formed at the control output terminal-side line, and power switching elements forming upper and lower arms for each phase are arranged in a zigzag formation along the control output terminal-side line with the power switching elements being offset from a substantially middle between the rotation shaft-side line and the control output terminal-side line toward the control output terminal-side line.

7. The electric power steering device as claimed in claim 6, wherein:

the power conversion circuit unit has
a earth wiring board extending in a longitudinal direction and functioning as an earth line that is arranged along the rotation shaft-side line;
a power supply wiring board extending in the longitudinal direction while being adjacent to the earth wiring board and functioning as a power supply line; and
three control wiring boards separately arranged along the control output terminal-side line while being adjacent to the power supply wiring board and each functioning as a control line, wherein the three-phase control output terminals are formed at the three control wiring boards respectively,
three upper arm power switching elements forming the upper arm are arranged on the power supply wiring board, and three lower arm power switching elements forming the lower arm are arranged on the three control wiring boards respectively, the three upper arm power switching elements and the three control wiring boards where the three lower arm power switching elements paired with the three upper arm power switching elements are arranged are connected through first jumper wires, and the three lower arm power switching elements and the earth wiring board are connected through second jumper wires.

8. The electric power steering device as claimed in claim 7, wherein:

the three upper arm power switching elements and the three lower arm power switching elements are arranged in the zigzag formation in a direction of the control output terminal-side line such that the lower arm power switching elements are positioned between the upper arm power switching elements respectively with a line of the upper arm power switching elements and a line of the lower arm power switching elements spaced a predetermined distance.

9. The electric power steering device as claimed in claim 8, wherein:

the power supply wiring board is formed into such a shape as sections where the upper arm power switching elements are arranged protrude toward the control wiring board sides, conversely, the control wiring boards are formed into shapes that retract so as to fit to respective protrusions of the shape of the power supply wiring board, and the control wiring boards are formed into such shapes as sections where the lower arm power switching elements are arranged protrude toward the power supply wiring board side, conversely, the power supply wiring board is formed into a shape that retracts so as to fit to the respective protrusions of the shapes of the control wiring boards.

10. The electric power steering device as claimed in claim 7, wherein:

a resin flow opening into which the synthetic resin flows is formed at a part of the earth wiring board and a part of the power supply wiring board.

* * * * *